(12) United States Patent
Hisano

(10) Patent No.: US 6,489,904 B1
(45) Date of Patent: Dec. 3, 2002

(54) PIPELINE ANALOG-TO-DIGITAL CONVERTER WITH ON-CHIP DIGITAL CALIBRATION

(75) Inventor: Shinichi Hisano, Colorado Springs, CO (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/916,553

(22) Filed: Jul. 27, 2001

(51) Int. Cl.[7] ............................................. H03M 1/10
(52) U.S. Cl. ........................ 341/120; 341/144; 341/155; 341/161
(58) Field of Search ................................. 341/161, 155, 341/156, 150, 144, 145, 122, 172, 110, 120, 131

(56) References Cited

U.S. PATENT DOCUMENTS

| | | | |
|---|---|---|---|
| 4,903,026 A | * 2/1990 | Tiemann et al. | 341/131 |
| 5,043,732 A | * 8/1991 | Robertson et al. | 341/156 |
| 5,047,772 A | * 9/1991 | Ribner | 341/156 |
| 5,274,377 A | * 12/1993 | Masuura et al. | 341/161 |
| 5,465,092 A | 11/1995 | Mayes et al. | 341/118 |
| 5,499,027 A | 3/1996 | Karanicolas et al. | 341/120 |
| 5,510,789 A | 4/1996 | Lee | 341/120 |
| 5,635,937 A | * 6/1997 | Lim et al. | 341/161 |
| 5,870,041 A | 2/1999 | Lee et al. | 341/118 |
| 6,348,888 B1 | * 2/2002 | Yu | 341/161 |
| 2001/0052869 A1 | * 12/2001 | Singer et al. | 341/156 |

OTHER PUBLICATIONS

Lee et al., "Digital–Domain Calibration of Multistep Analog–to–Digital Converters," IEEE Journal of Solid–State Circuits, vol. 27, No. 12, Dec., 1992, pp. 1679–1688.
Cline, "A Power Optimized 13–b 5 Msamples/s Pipelined Analog–to–Digital Converter in 1.2um CMOS," IEEE Journal of Solid–State Circuits, vol. 31, No. 3, Mar., 1996 pp. 294–303.

* cited by examiner

Primary Examiner—Brian Young
Assistant Examiner—John B Nguyen
(74) Attorney, Agent, or Firm—William E. Hein

(57) ABSTRACT

A multi-stage pipeline analog-to-digital converter employs an internal digital domain error detection and calibration algorithm to eliminate accumulated digital truncation errors to thereby improve its accuracy and linearity.

5 Claims, 14 Drawing Sheets

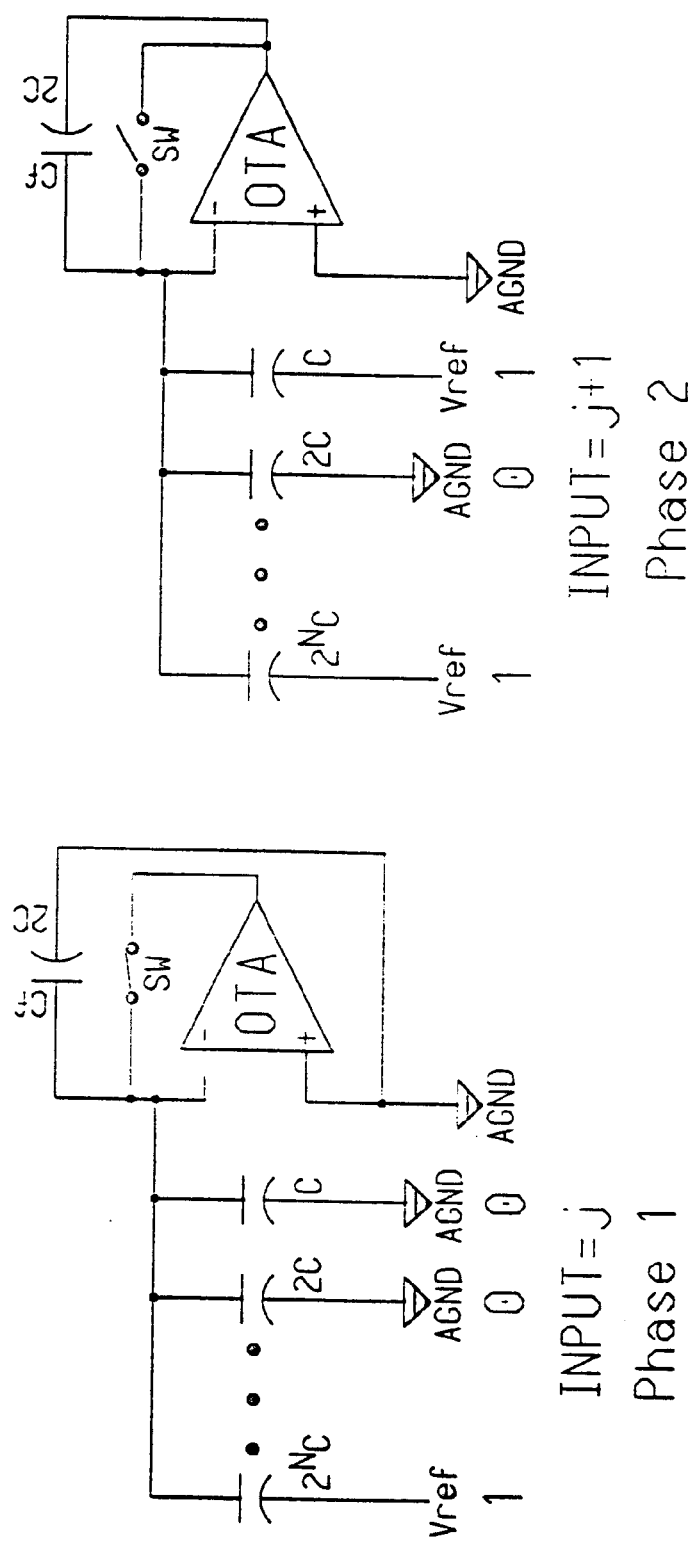

| | i=0 | i=1 | i=2 | i=3 | i=4 | i=5 | i=6 | i=7 | i=8 | i=9 | i=10 | i=11 | i=12 | i=13 | i=14 | i=15 | i=16 | Code Detected |
|---|---|---|---|---|---|---|---|---|---|---|---|---|---|---|---|---|---|---|
| | 1->0 | 1->0 | 1->0 | 1->0 | 0->1 | 0->1 | 0->1 | 0->1 | 0->1 | 0 | 0 | 0 | 1 | 1 | 1 | 1 | 1 | d24_00(0:8) |
| | 1->0 | 1->0 | 1->0 | 1->0 | 1 | 1 | 1 | 1 | 1 | 0 | 0 | 0->1 | 0 | 0 | 0 | 0 | 0 | d24_01(0:8) |
| | 1->0 | 1->0 | 1->0 | 0 | 0 | 0 | 0 | 0 | 0->1 | 0->1 | 0->1 | 0->1 | 0->1 | 0->1 | 0->1 | 0->1 | 0->1 | d24_02(0:8) |

FIG. 8

| | i=0 | i=1 | i=2 | i=3 | i=4 | i=5 | i=6 | i=7 | i=8 | i=9 | i=10 | i=11 | i=12 | i=13 | i=14 | i=15 | i=16 | Code Detected |
|---|---|---|---|---|---|---|---|---|---|---|---|---|---|---|---|---|---|---|
| | 1->0 | 1->0 | 1->0 | 1->0 | 0->1 | 0->1 | 0->1 | 0->1 | 0->1 | 0->1 | 0 | 0 | 0 | 1 | 1 | 1 | 1 | d25_00(0:8) |
| | 1->0 | 1->0 | 1->0 | 1->0 | 1 | 1 | 1 | 1 | 1 | 0 | 0 | 0 | 0 | 1 | 1 | 1 | 1 | d25_01(0:8) |
| | 1->0 | 1->0 | 1->0 | 1->0 | 0->1 | 0->1 | 0->1 | 0->1 | 0->1 | 0->1 | 0->1 | 0->1 | 0->1 | 0 | 0 | 0 | 0 | d25_02(0:8) |
| | 1->0 | 1->0 | 1->0 | 1->0 | 0->1 | 0->1 | 0->1 | 0->1 | 0->1 | 0->1 | 0->1 | 0->1 | 0->1 | 0 | 0 | 0 | 0 | d25_03(0:8) |
| | 1->0 | 1->0 | 1->0 | 1->0 | 0->1 | 0->1 | 0->1 | 1 | 1 | 1 | 0->1 | 0->1 | 0->1 | 0->1 | 0 | 0 | 0 | d25_04(0:8) |
| | 1->0 | 1->0 | 1->0 | 1->0 | 1 | 1 | 1 | 1 | 1 | 1 | 0 | 0 | 0 | 0 | 0 | 0 | 0 | d25_05(0:8) |
| | 1->0 | 1->0 | 1->0 | 1->0 | 0->1 | 0->1 | 0->1 | 0->1 | 0->1 | 0 | 0->1 | 0->1 | 0->1 | 0->1 | 0->1 | 0->1 | 0->1 | d25_06(0:8) |
| | 1->0 | 1->0 | 1->0 | 1->0 | 0->1 | 0->1 | 0->1 | 0->1 | 0->1 | 0 | 0->1 | 0->1 | 0->1 | 0->1 | 0->1 | 0->1 | 0->1 | d25_07(0:8) |
| | 1->0 | 1->0 | 1->0 | 1->0 | 0->1 | 0->1 | 0->1 | 0->1 | 0->1 | 0 | 0->1 | 0->1 | 0->1 | 0->1 | 0->1 | 0->1 | 0->1 | d25_08(0:8) |
| | 1->0 | 1->0 | 1->0 | 1->0 | 0->1 | 0->1 | 0->1 | 0->1 | 0->1 | 0 | 0->1 | 0->1 | 0->1 | 0->1 | 0->1 | 0->1 | 0->1 | d25_09(0:8) |
| | 1->0 | 1->0 | 1->0 | 1->0 | 0->1 | 0->1 | 0->1 | 0->1 | 0->1 | 0 | 0->1 | 0->1 | 1 | 1 | 0->1 | 0->1 | 0->1 | d25_10(0:8) |

FIG. 9

| | i=0 | i=1 | i=2 | i=3 | i=4 | i=5 | i=6 | i=7 | i=8 | i=9 | i=10 | i=11 | i=12 | i=13 | i=14 | i=15 | i=16 | Code Detected |
|---|---|---|---|---|---|---|---|---|---|---|---|---|---|---|---|---|---|---|
| | 1->0 | 1->0 | 1->0 | 1->0 | 1->0 | 1->0 | 0->1 | 0->1 | 0->1 | 0->1 | 0->1 | 0->1 | 0 | | | | | d26_00(0:8) |
| | 1->0 | 1->0 | 1->0 | 1->0 | 1->0 | 1->0 | 1 | 0 | 0 | 0 | 0 | 0 | 0 | 0 | 1 | 1 | 1 | d26_01(0:8) |
| | 1->0 | 1->0 | 1->0 | 1->0 | 1->0 | 0->1 | 0 | 0->1 | 0->1 | 0->1 | 0->1 | 0->1 | 0->1 | 0->1 | 0 | 0 | 0 | d26_02(0:8) |
| | 1->0 | 1->0 | 1->0 | 1->0 | 1->0 | 0->1 | 0->1 | 0->1 | 1 | 1 | 1 | 1 | 1 | 1 | 0->1 | 0->1 | 0->1 | d26_03(0:8) |
| | 1->0 | 1->0 | 1->0 | 1->0 | 1->0 | 0->1 | 0->1 | 0->1 | 0->1 | 0->1 | 0 | 1 | 1 | 0->1 | 0->1 | 0->1 | 0->1 | d26_04(0:8) |

FIG. 10

| | i=0 | i=1 | i=2 | i=3 | i=4 | i=5 | i=6 | i=7 | i=8 | i=9 | i=10 | i=11 | i=12 | i=13 | i=14 | i=15 | i=16 | Code Detected |
|---|---|---|---|---|---|---|---|---|---|---|---|---|---|---|---|---|---|---|
| | 1->0 | 1->0 | 1->0 | 1->0 | 1->0 | 1->0 | 0->1 | 0->1 | 0->1 | 0->1 | 0->1 | 0->1 | 0->1 | 0->1 | 0 | 1 | 1 | d27_00(0:8) |
| | 1->0 | 1->0 | 1->0 | 1->0 | 1->0 | 1->0 | 1 | 0 | 0 | 0 | 0 | 0 | 0 | 0 | 0->1 | 0 | 0 | d27_01(0:8) |
| | 1->0 | 1->0 | 1->0 | 1->0 | 1->0 | 1->0 | 0->1 | 0->1 | 1 | 1 | 1 | 0 | 0->1 | 0->1 | 0->1 | 0->1 | 0->1 | d27_02(0:8) |
| | 1->0 | 1->0 | 1->0 | 1->0 | 1->0 | 1->0 | 0->1 | 0->1 | 0 | 0 | 0->1 | 0->1 | 0->1 | 0->1 | 0->1 | 0->1 | 0->1 | d27_03(0:8) |
| | 1->0 | 1->0 | 1->0 | 1->0 | 1->0 | 1->0 | 0->1 | 0->1 | 0->1 | 0->1 | 1 | 0->1 | 0->1 | 0->1 | 0->1 | 0->1 | 0->1 | d27_04(0:8) |
| | 1->0 | 1->0 | 1->0 | 1->0 | 1->0 | 1->0 | 0->1 | 0->1 | 0->1 | 0->1 | 0->1 | 0->1 | 1 | 0->1 | 0->1 | 0->1 | 0->1 | d27_05(0:8) |
| | 1->0 | 1->0 | 1->0 | 1->0 | 1->0 | 1->0 | 0->1 | 0->1 | 0->1 | 0->1 | 0->1 | 0->1 | 0 | 1 | 0->1 | 0->1 | 0->1 | d27_06(0:8) |
| | 1->0 | 1->0 | 1->0 | 1->0 | 1->0 | 1->0 | 0->1 | 0->1 | 0->1 | 0->1 | 0->1 | 0->1 | 0->1 | 0 | 1 | 0->1 | 0->1 | d27_07(0:8) |
| | 1->0 | 1->0 | 1->0 | 1->0 | 1->0 | 1->0 | 0->1 | 0->1 | 0->1 | 0->1 | 0->1 | 0->1 | 0->1 | 0->1 | 1 | 0->1 | 0->1 | d27_08(0:8) |

FIG. 11

| | i=0 | i=1 | i=2 | i=3 | i=4 | i=5 | i=6 | i=7 | i=8 | i=9 | i=10 | i=11 | i=12 | i=13 | i=14 | i=15 | i=16 | Code Detected |
|---|---|---|---|---|---|---|---|---|---|---|---|---|---|---|---|---|---|---|
| | 1->0 | 1->0 | 1->0 | 1->0 | 1->0 | 1->0 | 1->0 | 1->0 | 0->1 | 0->1 | 0->1 | 0->1 | 0->1 | 0->1 | 0->1 | 0->1 | 0->1 | d28_00(0:8) |

FIG. 12

| i=0 | i=1 | i=2 | i=3 | i=4 | i=5 | i=6 | i=7 | i=8 | i=9 | i=10 | i=11 | i=12 | i=13 | i=14 | i=15 | i=16 | Code Detected |
|---|---|---|---|---|---|---|---|---|---|---|---|---|---|---|---|---|---|
| 1->0 | 1->0 | 1->0 | 1->0 | 1->0 | 1->0 | 1->0 | 1->0 | 0->1 | 0->1 | 0->1 | 0->1 | 0->1 | 0->1 | 0->1 | 0->1 | 0->1 | d29_00(0:8) |
| 0->1 | 1->0 | 1->0 | 1->0 | 1->0 | 1->0 | 1->0 | 1->0 | 1->0 | 0->1 | 0->1 | 0->1 | 0->1 | 0->1 | 0->1 | 0->1 | 0->1 | d29_01(0:8) |
| 1->0 | 0->1 | 1->0 | 1->0 | 1->0 | 1->0 | 1->0 | 1->0 | 1->0 | 0->1 | 0->1 | 0->1 | 0->1 | 0->1 | 0->1 | 0->1 | 0->1 | d29_02(0:8) |
| 1->0 | 1->0 | 0->1 | 1->0 | 1->0 | 1->0 | 1->0 | 1->0 | 1->0 | 0->1 | 0->1 | 0->1 | 0->1 | 0->1 | 0->1 | 0->1 | 0->1 | d29_03(0:8) |
| 1->0 | 1->0 | 1->0 | 0->1 | 1->0 | 1->0 | 1->0 | 1->0 | 1->0 | 0->1 | 0->1 | 0->1 | 0->1 | 0->1 | 0->1 | 0->1 | 0->1 | d29_04(0:8) |
| 1->0 | 1->0 | 1->0 | 1->0 | 0->1 | 1->0 | 1->0 | 1->0 | 1->0 | 0->1 | 0->1 | 0->1 | 0->1 | 0->1 | 0->1 | 0->1 | 0->1 | d29_05(0:8) |
| 1->0 | 1->0 | 1->0 | 1->0 | 1->0 | 0->1 | 1->0 | 1->0 | 1->0 | 0->1 | 0->1 | 0->1 | 0->1 | 0->1 | 0->1 | 0->1 | 0->1 | d29_06(0:8) |
| 1->0 | 1->0 | 1->0 | 1->0 | 1->0 | 1->0 | 0->1 | 1->0 | 1->0 | 0->1 | 0->1 | 0->1 | 0->1 | 0->1 | 0->1 | 0->1 | 0->1 | d29_07(0:8) |
| 1->0 | 1->0 | 1->0 | 1->0 | 1->0 | 1->0 | 1->0 | 0->1 | 1->0 | 0->1 | 0->1 | 0->1 | 0->1 | 0->1 | 0->1 | 0->1 | 0->1 | d29_08(0:8) |

FIG. 13

| i=0 | i=1 | i=2 | i=3 | i=4 | i=5 | i=6 | i=7 | i=8 | i=9 | i=10 | i=11 | i=12 | i=13 | i=14 | i=15 | i=16 | Code Detected |
|---|---|---|---|---|---|---|---|---|---|---|---|---|---|---|---|---|---|
| 1->0 | 1->0 | 1->0 | 1->0 | 1->0 | 1->0 | 1->0 | 1->0 | 0->1 | 0->1 | 0->1 | 0->1 | 0->1 | 0->1 | 0->1 | 0->1 | 0->1 | d210_00(0:8) |
| 0->1 | 1->0 | 1->0 | 1->0 | 1->0 | 1->0 | 1->0 | 1->0 | 1->0 | 0->1 | 0->1 | 0->1 | 0->1 | 0->1 | 0->1 | 0->1 | 0->1 | d210_01(0:8) |
| 0->1 | 0->1 | 1->0 | 1->0 | 1->0 | 1->0 | 1->0 | 1->0 | 1->0 | 1->0 | 0->1 | 0->1 | 0->1 | 0->1 | 0->1 | 0->1 | 0->1 | d210_02(0:8) |
| 1->0 | 0->1 | 1->0 | 1->0 | 1->0 | 1->0 | 1->0 | 1->0 | 1->0 | 1->0 | 0->1 | 0->1 | 0->1 | 0->1 | 0->1 | 0->1 | 0->1 | d210_03(0:8) |
| 1->0 | 1->0 | 0->1 | 1->0 | 1->0 | 1->0 | 1->0 | 1->0 | 1->0 | 1->0 | 0->1 | 0->1 | 0->1 | 0->1 | 0->1 | 0->1 | 0->1 | d210_04(0:8) |
| 1->0 | 1->0 | 1->0 | 0->1 | 0->1 | 0->1 | 0->1 | 1->0 | 1->0 | 1->0 | 0->1 | 0->1 | 0->1 | 0->1 | 0->1 | 0->1 | 0->1 | d210_05(0:8) |
| 1->0 | 1->0 | 1->0 | 1->0 | 0->1 | 0->1 | 0->1 | 0->1 | 1->0 | 1->0 | 0->1 | 0->1 | 0->1 | 0->1 | 0->1 | 0->1 | 0->1 | d210_06(0:8) |
| 1->0 | 1->0 | 1->0 | 1->0 | 1->0 | 0->1 | 0->1 | 0->1 | 0->1 | 1->0 | 0->1 | 0->1 | 0->1 | 0->1 | 0->1 | 0->1 | 0->1 | d210_07(0:8) |
| 1->0 | 1->0 | 1->0 | 1->0 | 1->0 | 1->0 | 0->1 | 1->0 | 1->0 | 1->0 | 0->1 | 0->1 | 0->1 | 0->1 | 0->1 | 0->1 | 0->1 | d210_08(0:8) |
| 1->0 | 1->0 | 1->0 | 1->0 | 1->0 | 1->0 | 1->0 | 0->1 | 1->0 | 1->0 | 0->1 | 0->1 | 0->1 | 0->1 | 0->1 | 0->1 | 0->1 | d210_09(0:8) |

FIG. 14

| i=0 | i=1 | i=2 | i=3 | i=4 | i=5 | i=6 | i=7 | i=8 | i=9 | i=10 | i=11 | i=12 | i=13 | i=14 | i=15 | i=16 | Code Detected |
|---|---|---|---|---|---|---|---|---|---|---|---|---|---|---|---|---|---|
| 1->0 | 1->0 | 1->0 | 1->0 | 1->0 | 1->0 | 1->0 | 1->0 | 0->1 | 0->1 | 0->1 | 0->1 | 0->1 | 0->1 | 0->1 | 0->1 | 0->1 | d211_00(0:8) |
| 0->1 | 1->0 | 1->0 | 1->0 | 1->0 | 1->0 | 1->0 | 1->0 | 1->0 | 0->1 | 0->1 | 0->1 | 0->1 | 0->1 | 0->1 | 0->1 | 0->1 | d211_01(0:8) |
| 0->1 | 0->1 | 1->0 | 1->0 | 1->0 | 1->0 | 1->0 | 1->0 | 1->0 | 1->0 | 0->1 | 0->1 | 0->1 | 0->1 | 0->1 | 0->1 | 0->1 | d211_02(0:8) |
| 0->1 | 0->1 | 0->1 | 1->0 | 1->0 | 1->0 | 1->0 | 1->0 | 1->0 | 1->0 | 1->0 | 0->1 | 0->1 | 0->1 | 0->1 | 0->1 | 0->1 | d211_03(0:8) |
| 1->0 | 0->1 | 0->1 | 0->1 | 1->0 | 1->0 | 1->0 | 1->0 | 1->0 | 1->0 | 1->0 | 1->0 | 0->1 | 0->1 | 0->1 | 0->1 | 0->1 | d211_04(0:8) |
| 1->0 | 1->0 | 0->1 | 0->1 | 0->1 | 1->0 | 1->0 | 1->0 | 1->0 | 1->0 | 1->0 | 1->0 | 1->0 | 0->1 | 0->1 | 0->1 | 0->1 | d211_05(0:8) |
| 1->0 | 1->0 | 1->0 | 0->1 | 0->1 | 0->1 | 1->0 | 1->0 | 1->0 | 1->0 | 1->0 | 1->0 | 1->0 | 1->0 | 0->1 | 0->1 | 0->1 | d211_06(0:8) |
| 1->0 | 1->0 | 1->0 | 1->0 | 0->1 | 0->1 | 0->1 | 1->0 | 1->0 | 1->0 | 1->0 | 1->0 | 1->0 | 1->0 | 1->0 | 0->1 | 0->1 | d211_07(0:8) |
| 1->0 | 1->0 | 1->0 | 1->0 | 1->0 | 0->1 | 0->1 | 0->1 | 0->1 | 1->0 | 1->0 | 1->0 | 1->0 | 1->0 | 1->0 | 1->0 | 0->1 | d211_08(0:8) |
| 1->0 | 1->0 | 1->0 | 1->0 | 1->0 | 1->0 | 0->1 | 0->1 | 0->1 | 0->1 | 1->0 | 1->0 | 1->0 | 1->0 | 1->0 | 1->0 | 0->1 | d211_09(0:8) |
| 1->0 | 1->0 | 1->0 | 1->0 | 1->0 | 1->0 | 1->0 | 0->1 | 0->1 | 0->1 | 0->1 | 1->0 | 1->0 | 1->0 | 1->0 | 1->0 | 0->1 | d211_10(0:8) |

FIG. 15

| i=0 | i=1 | i=2 | i=3 | i=4 | i=5 | i=6 | i=7 | i=8 | i=9 | i=10 | i=11 | i=12 | i=13 | i=14 | i=15 | i=16 | Code Detected |
|---|---|---|---|---|---|---|---|---|---|---|---|---|---|---|---|---|---|
| 1->0 | 1->0 | 1->0 | 1->0 | 1->0 | 1->0 | 1->0 | 1->0 | 0->1 | 0->1 | 0->1 | 0->1 | 0->1 | 0->1 | 0->1 | 0->1 | 0->1 | d212_00(0:8) |
| 0->1 | 1->0 | 1->0 | 1->0 | 1->0 | 1->0 | 1->0 | 1->0 | 1->0 | 0->1 | 0->1 | 0->1 | 0->1 | 0->1 | 0->1 | 0->1 | 0->1 | d212_01(0:8) |
| 0->1 | 0->1 | 1->0 | 1->0 | 1->0 | 1->0 | 1->0 | 1->0 | 1->0 | 1->0 | 0->1 | 0->1 | 0->1 | 0->1 | 0->1 | 0->1 | 0->1 | d212_02(0:8) |
| 0->1 | 0->1 | 0->1 | 1->0 | 1->0 | 1->0 | 1->0 | 1->0 | 1->0 | 1->0 | 1->0 | 0->1 | 0->1 | 0->1 | 0->1 | 0->1 | 0->1 | d212_03(0:8) |
| 0->1 | 0->1 | 0->1 | 0->1 | 1->0 | 1->0 | 1->0 | 1->0 | 1->0 | 1->0 | 1->0 | 1->0 | 0->1 | 0->1 | 0->1 | 0->1 | 0->1 | d212_04(0:8) |
| 0->1 | 0->1 | 0->1 | 0->1 | 0->1 | 1->0 | 1->0 | 1->0 | 1->0 | 1->0 | 1->0 | 1->0 | 1->0 | 0->1 | 0->1 | 0->1 | 0->1 | d212_05(0:8) |
| 1->0 | 1->0 | 1->0 | 0->1 | 0->1 | 0->1 | 1->0 | 1->0 | 1->0 | 1->0 | 1->0 | 1->0 | 1->0 | 1->0 | 0->1 | 0->1 | 0->1 | d212_06(0:8) |
| 1->0 | 1->0 | 1->0 | 1->0 | 0->1 | 0->1 | 0->1 | 1->0 | 1->0 | 1->0 | 1->0 | 1->0 | 1->0 | 1->0 | 1->0 | 0->1 | 0->1 | d212_07(0:8) |
| 1->0 | 1->0 | 1->0 | 1->0 | 1->0 | 0->1 | 0->1 | 0->1 | 0->1 | 1->0 | 1->0 | 1->0 | 1->0 | 1->0 | 1->0 | 1->0 | 0->1 | d212_08(0:8) |
| 1->0 | 1->0 | 1->0 | 1->0 | 1->0 | 1->0 | 0->1 | 0->1 | 0->1 | 0->1 | 1->0 | 1->0 | 1->0 | 1->0 | 1->0 | 1->0 | 0->1 | d212_09(0:8) |
| 1->0 | 1->0 | 1->0 | 1->0 | 1->0 | 1->0 | 1->0 | 0->1 | 0->1 | 0->1 | 0->1 | 1->0 | 1->0 | 1->0 | 1->0 | 1->0 | 0->1 | d212_10(0:8) |
| 1->0 | 1->0 | 1->0 | 1->0 | 1->0 | 1->0 | 1->0 | 1->0 | 0->1 | 0->1 | 0->1 | 0->1 | 1->0 | 1->0 | 1->0 | 1->0 | 0->1 | d212_11(0:8) |

| i=0 | i=1 | i=2 | i=3 | i=4 | i=5 | i=6 | i=7 | i=8 | i=9 | i=10 | i=11 | i=12 | i=13 | i=14 | i=15 | i=16 | Code Detected |
|---|---|---|---|---|---|---|---|---|---|---|---|---|---|---|---|---|---|
| 1->0 | 1->0 | 1->0 | 1->0 | 1->0 | 1->0 | 1->0 | 1->0 | 0->1 | 0->1 | 0->1 | 0->1 | 0->1 | 0->1 | 0->1 | 0->1 | 0->1 | d213_00(0:8) |
| 0->1 | 1->0 | 1->0 | 1->0 | 1->0 | 1->0 | 1->0 | 1->0 | 1->0 | 0->1 | 0->1 | 0->1 | 0->1 | 0->1 | 0->1 | 0->1 | 0->1 | d213_01(0:8) |
| 0->1 | 0->1 | 1->0 | 1->0 | 1->0 | 1->0 | 1->0 | 1->0 | 1->0 | 1->0 | 0->1 | 0->1 | 0->1 | 0->1 | 0->1 | 0->1 | 0->1 | d213_02(0:8) |
| 0->1 | 0->1 | 0->1 | 1->0 | 1->0 | 1->0 | 1->0 | 1->0 | 1->0 | 1->0 | 1->0 | 0->1 | 0->1 | 0->1 | 0->1 | 0->1 | 0->1 | d213_03(0:8) |
| 0->1 | 0->1 | 0->1 | 0->1 | 1->0 | 1->0 | 1->0 | 1->0 | 1->0 | 1->0 | 1->0 | 1->0 | 0->1 | 0->1 | 0->1 | 0->1 | 0->1 | d213_04(0:8) |
| 0->1 | 0->1 | 0->1 | 0->1 | 0->1 | 1->0 | 1->0 | 1->0 | 1->0 | 1->0 | 1->0 | 1->0 | 1->0 | 0->1 | 0->1 | 0->1 | 0->1 | d213_05(0:8) |
| 0->1 | 0->1 | 0->1 | 0->1 | 0->1 | 0->1 | 1->0 | 1->0 | 1->0 | 1->0 | 1->0 | 1->0 | 1->0 | 0->1 | 0->1 | 0->1 | 0->1 | d213_06(0:8) |
| 1->0 | 0->1 | 0->1 | 0->1 | 0->1 | 0->1 | 0->1 | 1->0 | 1->0 | 1->0 | 1->0 | 1->0 | 1->0 | 0->1 | 0->1 | 0->1 | 0->1 | d213_07(0:8) |
| 1->0 | 1->0 | 0->1 | 0->1 | 0->1 | 0->1 | 0->1 | 0->1 | 1->0 | 1->0 | 1->0 | 1->0 | 1->0 | 0->1 | 0->1 | 0->1 | 0->1 | d213_08(0:8) |
| 1->0 | 1->0 | 1->0 | 0->1 | 0->1 | 0->1 | 0->1 | 0->1 | 0->1 | 1->0 | 1->0 | 1->0 | 1->0 | 0->1 | 0->1 | 0->1 | 0->1 | d213_09(0:8) |
| 1->0 | 1->0 | 1->0 | 1->0 | 0->1 | 0->1 | 0->1 | 0->1 | 0->1 | 0->1 | 0->1 | 1->0 | 1->0 | 0->1 | 0->1 | 0->1 | 0->1 | d213_10(0:8) |
| 1->0 | 1->0 | 1->0 | 1->0 | 1->0 | 0->1 | 0->1 | 0->1 | 0->1 | 0->1 | 0->1 | 0->1 | 1->0 | 0->1 | 0->1 | 0->1 | 0->1 | d213_11(0:8) |
| 1->0 | 1->0 | 1->0 | 1->0 | 1->0 | 1->0 | 1->0 | 0->1 | 0->1 | 0->1 | 0->1 | 0->1 | 1->0 | 0->1 | 0->1 | 0->1 | 0->1 | d213_12(0:8) |

FIG. 16

| i=0 | i=1 | i=2 | i=3 | i=4 | i=5 | i=6 | i=7 | i=8 | i=9 | i=10 | i=11 | i=12 | i=13 | i=14 | i=15 | i=16 | Code Detected |
|---|---|---|---|---|---|---|---|---|---|---|---|---|---|---|---|---|---|
| 1->0 | 1->0 | 1->0 | 1->0 | 1->0 | 1->0 | 1->0 | 1->0 | 0->1 | 0->1 | 0->1 | 0->1 | 0->1 | 0->1 | 0->1 | 0->1 | 0->1 | d214_00(0:8) |
| 0->1 | 1->0 | 1->0 | 1->0 | 1->0 | 1->0 | 1->0 | 1->0 | 1->0 | 0->1 | 0->1 | 0->1 | 0->1 | 0->1 | 0->1 | 0->1 | 0->1 | d214_01(0:8) |
| 0->1 | 0->1 | 1->0 | 1->0 | 1->0 | 1->0 | 1->0 | 1->0 | 1->0 | 1->0 | 0->1 | 0->1 | 0->1 | 0->1 | 0->1 | 0->1 | 0->1 | d214_02(0:8) |
| 0->1 | 0->1 | 0->1 | 1->0 | 1->0 | 1->0 | 1->0 | 1->0 | 1->0 | 1->0 | 1->0 | 0->1 | 0->1 | 0->1 | 0->1 | 0->1 | 0->1 | d214_03(0:8) |
| 0->1 | 0->1 | 0->1 | 0->1 | 1->0 | 1->0 | 1->0 | 1->0 | 1->0 | 1->0 | 1->0 | 1->0 | 0->1 | 0->1 | 0->1 | 0->1 | 0->1 | d214_04(0:8) |
| 0->1 | 0->1 | 0->1 | 0->1 | 0->1 | 1->0 | 1->0 | 1->0 | 1->0 | 1->0 | 1->0 | 1->0 | 1->0 | 0->1 | 0->1 | 0->1 | 0->1 | d214_05(0:8) |
| 0->1 | 0->1 | 0->1 | 0->1 | 0->1 | 0->1 | 1->0 | 1->0 | 1->0 | 1->0 | 1->0 | 1->0 | 1->0 | 1->0 | 0->1 | 0->1 | 0->1 | d214_06(0:8) |
| 0->1 | 0->1 | 0->1 | 0->1 | 0->1 | 0->1 | 0->1 | 1->0 | 1->0 | 1->0 | 1->0 | 1->0 | 1->0 | 1->0 | 0->1 | 0->1 | 0->1 | d214_07(0:8) |
| 1->0 | 1->0 | 0->1 | 0->1 | 0->1 | 0->1 | 0->1 | 0->1 | 0->1 | 1->0 | 1->0 | 1->0 | 1->0 | 1->0 | 0->1 | 0->1 | 0->1 | d214_08(0:8) |
| 1->0 | 1->0 | 1->0 | 0->1 | 0->1 | 0->1 | 0->1 | 0->1 | 0->1 | 0->1 | 1->0 | 1->0 | 1->0 | 1->0 | 0->1 | 0->1 | 0->1 | d214_09(0:8) |
| 1->0 | 1->0 | 1->0 | 1->0 | 0->1 | 0->1 | 0->1 | 0->1 | 0->1 | 0->1 | 0->1 | 1->0 | 1->0 | 1->0 | 0->1 | 0->1 | 0->1 | d214_10(0:8) |
| 1->0 | 1->0 | 1->0 | 1->0 | 1->0 | 0->1 | 0->1 | 0->1 | 0->1 | 0->1 | 0->1 | 0->1 | 1->0 | 1->0 | 0->1 | 0->1 | 0->1 | d214_11(0:8) |
| 1->0 | 1->0 | 1->0 | 1->0 | 1->0 | 1->0 | 0->1 | 0->1 | 0->1 | 0->1 | 0->1 | 0->1 | 0->1 | 1->0 | 0->1 | 0->1 | 0->1 | d214_12(0:8) |
| 1->0 | 1->0 | 1->0 | 1->0 | 1->0 | 1->0 | 1->0 | 0->1 | 0->1 | 0->1 | 0->1 | 0->1 | 0->1 | 1->0 | 0->1 | 0->1 | 0->1 | d214_13(0:8) |

FIG. 17

| i=0 | i=1 | i=2 | i=3 | i=4 | i=5 | i=6 | i=7 | i=8 | i=9 | i=10 | i=11 | i=12 | i=13 | i=14 | i=15 | i=16 | Code Detected |
|---|---|---|---|---|---|---|---|---|---|---|---|---|---|---|---|---|---|
| 1->0 | 1->0 | 1->0 | 1->0 | 1->0 | 1->0 | 1->0 | 1->0 | 0->1 | 0->1 | 0->1 | 0->1 | 0->1 | 0->1 | 0->1 | 0->1 | 0->1 | d215_00(0:8) |
| 0->1 | 0->1 | 1->0 | 1->0 | 1->0 | 1->0 | 1->0 | 1->0 | 1->0 | 0->1 | 0->1 | 0->1 | 0->1 | 0->1 | 0->1 | 0->1 | 0->1 | d215_01(0:8) |
| 0->1 | 0->1 | 0->1 | 1->0 | 1->0 | 1->0 | 1->0 | 1->0 | 1->0 | 0->1 | 0->1 | 0->1 | 0->1 | 0->1 | 0->1 | 0->1 | 0->1 | d215_02(0:8) |
| 0->1 | 0->1 | 0->1 | 0->1 | 1->0 | 1->0 | 1->0 | 1->0 | 1->0 | 1->0 | 0->1 | 0->1 | 0->1 | 0->1 | 0->1 | 0->1 | 0->1 | d215_03(0:8) |
| 0->1 | 0->1 | 0->1 | 0->1 | 0->1 | 1->0 | 1->0 | 1->0 | 1->0 | 1->0 | 0->1 | 0->1 | 0->1 | 0->1 | 0->1 | 0->1 | 0->1 | d215_04(0:8) |
| 0->1 | 0->1 | 0->1 | 0->1 | 0->1 | 0->1 | 1->0 | 1->0 | 1->0 | 1->0 | 1->0 | 0->1 | 0->1 | 0->1 | 0->1 | 0->1 | 0->1 | d215_05(0:8) |
| 0->1 | 0->1 | 0->1 | 0->1 | 0->1 | 0->1 | 0->1 | 1->0 | 1->0 | 1->0 | 1->0 | 1->0 | 0->1 | 0->1 | 0->1 | 0->1 | 0->1 | d215_06(0:8) |
| 0->1 | 0->1 | 0->1 | 0->1 | 0->1 | 0->1 | 0->1 | 0->1 | 1->0 | 1->0 | 1->0 | 1->0 | 1->0 | 0->1 | 0->1 | 0->1 | 0->1 | d215_07(0:8) |
| 1->0 | 0->1 | 0->1 | 0->1 | 0->1 | 0->1 | 0->1 | 0->1 | 0->1 | 1->0 | 1->0 | 1->0 | 1->0 | 1->0 | 0->1 | 0->1 | 0->1 | d215_08(0:8) |
| 1->0 | 1->0 | 0->1 | 0->1 | 0->1 | 0->1 | 0->1 | 0->1 | 0->1 | 0->1 | 1->0 | 1->0 | 1->0 | 1->0 | 0->1 | 0->1 | 0->1 | d215_09(0:8) |
| 1->0 | 1->0 | 1->0 | 0->1 | 0->1 | 0->1 | 0->1 | 0->1 | 0->1 | 0->1 | 0->1 | 1->0 | 1->0 | 1->0 | 1->0 | 0->1 | 0->1 | d215_10(0:8) |
| 1->0 | 1->0 | 1->0 | 1->0 | 0->1 | 0->1 | 0->1 | 0->1 | 0->1 | 0->1 | 0->1 | 0->1 | 1->0 | 1->0 | 1->0 | 0->1 | 0->1 | d215_11(0:8) |
| 1->0 | 1->0 | 1->0 | 1->0 | 1->0 | 0->1 | 0->1 | 0->1 | 0->1 | 0->1 | 0->1 | 0->1 | 0->1 | 1->0 | 1->0 | 1->0 | 0->1 | d215_12(0:8) |
| 1->0 | 1->0 | 1->0 | 1->0 | 1->0 | 1->0 | 0->1 | 0->1 | 0->1 | 0->1 | 0->1 | 0->1 | 0->1 | 0->1 | 1->0 | 1->0 | 0->1 | d215_13(0:8) |
| 1->0 | 1->0 | 1->0 | 1->0 | 1->0 | 1->0 | 1->0 | 0->1 | 0->1 | 0->1 | 0->1 | 0->1 | 0->1 | 0->1 | 0->1 | 0->1 | 0->1 | d215_14(0:8) |

FIG. 18

PIPELINE ANALOG-TO-DIGITAL CONVERTER WITH ON-CHIP DIGITAL CALIBRATION

BACKGROUND AND SUMMARY OF THE INVENTION

The present invention relates generally to analog-to-digital converters, hereinafter referred to as ADCs, and, more particularly, to a pipeline ADC employing internal digital calibration to improve linearity of the ADC.

Multi-stage pipeline ADCs exhibit the distinct advantage of achieving a high sample rate for low power, compared to other architectures such as flash and successive approximation. For this reason, pipeline ADCs have been widely used in many applications, especially those that can tolerate this architecture's inherent delay between the time the input signal is sampled and the time the digitized output becomes available. Exemplary of these applications are image capture applications such as ultrasound, video cameras, scanners, etc., as well as intermediate frequency demodulation in wireless communications applications and various laboratory instrumentation applications.

Recent advancements in these applications have pushed the resolution requirement for ADCs to 12 bits or higher. In order to meet this level of performance demand, a number of digital domain error calibration techniques have been developed. In the case of multi-stage pipeline ADCs with 1.5 bits per stage, U.S. Pat. No. 5,465,092 to Mayes et al., U.S. Pat. No. 5,499,027 to Karanicolas et al., and U.S. Pat. No. 5,510,789 to Lee describe a means for detecting and correcting errors in reconstruction digital-to-analog converters in each stage. This 1.5 bits per stage architecture is simple to design and also to calibrate because all stages have the same circuit topology. Its disadvantage is that it inherently consumes more power than a multi bits per stage counterpart described in Cline et al., "A Power Optimized 13-b 5M samples/s Pipelined Analog-to-Digital Converter in 1.2 um CMOS," IEEE Journal of Solid State Circuits, March, 1996, pp. 294–303.

Lee et al., "Digital-Domain Calibration of Multistep Analog-to-Digital Converters," IEEE Journal of Solid State Circuits, December, 1992, pp. 1679–1688, proposes a means of digitally calibrating a multi bits per stage pipeline ADC. This reference teaches a means for detecting an error between two adjacent codes of a multiplying DAC (MDAC) composed of a capacitor array and an operational transconductance amplifier (OTA), by the subsequent stages of the ADC. As each code transition error or differential linearity error (DLE) is measured, it is digitally accumulated to derive the linearity error of all codes or integral linearity error (ILE). As acknowledged by the authors in this reference, this digital accumulation technique inherently suffers from digital truncation errors, which increase as the resolution of each stage increases.

The prior art circuits of FIGS. 1A and 1B serve to measure an MDAC's segment error for code transition from j to j+1. The MDAC is composed of the operational transconductance amplifier (OTA), feed back capacitor Cf, the binary weighted capacitor array, the sampling switch SW, and other switches that selectively connect bottom plates of the capacitor array to terminals Vref or AGND, or to an output from the previous stage. The latter switches are not shown in FIGS. 1A and 1B for clarity. The non-overlapping clock signals in FIG. 1C control this two phase operation. During the first clock phase, Phase 1, the clock signal qs is high. The clock signal qg is high in the second clock phase, Phase 2. The clock signal qsp controls the sampling switch SW, and is identical to clock signal qs except that it has a preceding falling edge. In Phase 1, the bottom plates of the capacitor array are driven to the voltages at either of terminals Vref or AGND in accordance to the digital input j. At the same time, OTA is configured to be a unity gain buffer, and the bottom plate of capacitor Cf connects to terminal AGND. At the end of Phase 1, the sampling switch SW opens and traps the charge on the common top plate of all the capacitors. In Phase 2, the bottom plates of the capacitor array are driven according to the digital input j+1. The feedback capacitor Cf is connected between the output and the negative input of the OTA, thereby closing the loop. The output of OTA at the end of Phase 2 would ideally be equal to Vref/2. Any deviation from this ideal voltage is an error voltage, or DLE, associated with the code transition between code j and j+1. The error voltage is digitized by the subsequent stages of the ADC. This sequence is repeated for every code increment, and the results are incrementally accumulated in digital domain to derive the digital representation of ILE for all codes of the MDAC. The accumulation of code transition errors in digital domain by definition accumulates the digital truncation errors of all code transition errors.

U.S. Pat. No. 5,870,041 to Lee et al. recognizes this digital truncation error problem and attempts to reduce the truncation error just by increasing resolution of the over-all ADC used during error detection. This approach is common to minimizing truncation errors in general, but it does not solve the fundamental problem of truncation error limitations that stem from the error detection algorithm originally proposed in the above-cited paper authored by Lee et al. It also requires that all analog signals must settle to a higher resolution level with a small lsb size, which limits the maximum speed attainable for a given technology and power consumption.

Another practical limitation of the prior art circuits of FIGS. 1A and 1B is that the voltage reference, Vref changes between the two clock phases, due to its finite output impedance, thus limiting its capability to absorb switching transients and maintain the output voltage. This limitation becomes more pronounced for higher resolution, higher speed ADCs.

It would therefore be advantageous to provide a digital domain error detection and calibration algorithm for a multi stage pipeline ADC that is free from accumulation of digital truncation errors to thereby provide a multi stage pipeline ADC of inherently higher accuracy.

It would also be advantageous to provide a digital domain error detection method which exhibits greatly reduced sensitivity to changes in the reference voltage from one phase of operation to the other.

It would be further advantageous to provide a multi-stage pipeline ADC architecture that incorporates digital circuitry to perform the aforementioned digital domain error detection and calibration algorithm.

It would be further advantageous to provide a high speed, high resolution multi-stage pipeline ADC which offers superior performance with respect to accuracy, linearity, offset, gain error, total harmonic distortion (THD), spurious free dynamic range (SFDR), signal to noise ratio (SNR), and effective number of bits (ENOBs).

It would also be advantageous to provide a complementary metal oxide semiconductor process for implementing a multi stage pipeline ADC.

BRIEF DESCRIPTION OF THE DRAWINGS

FIGS. 1A and 1B are circuit diagrams illustrating two prior art clock phase circuits for detecting code segment error of a binary-weighted capacitor MDAC.

FIGS. 3–18 illustrate sets of digital codes in accordance with the present invention that are employed in a fully segmented MDAC for the two-phase operation to detect the MDAC error at code 0 to 15 in decimal.

DETAILED DESCRIPTION OF THE INVENTION

Figure 1C:
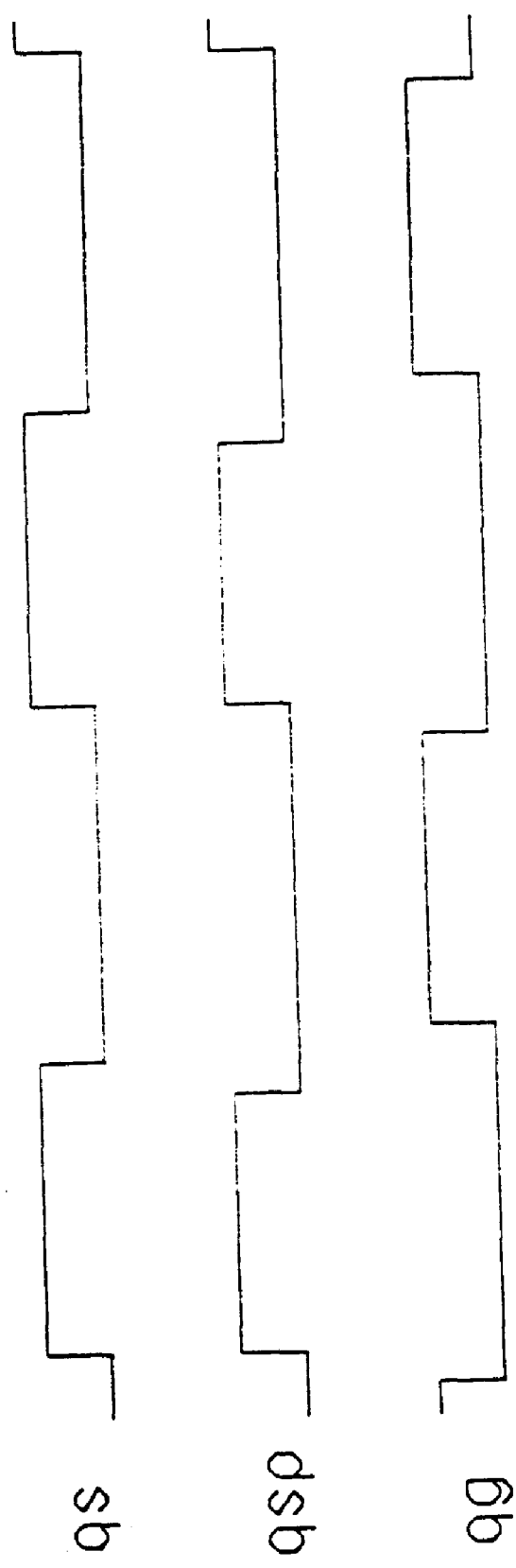
FIG. 1C is a waveform diagram of the clock signals that control operation of the two prior art circuits of FIGS. 1A and 1B.
Figure 2B:
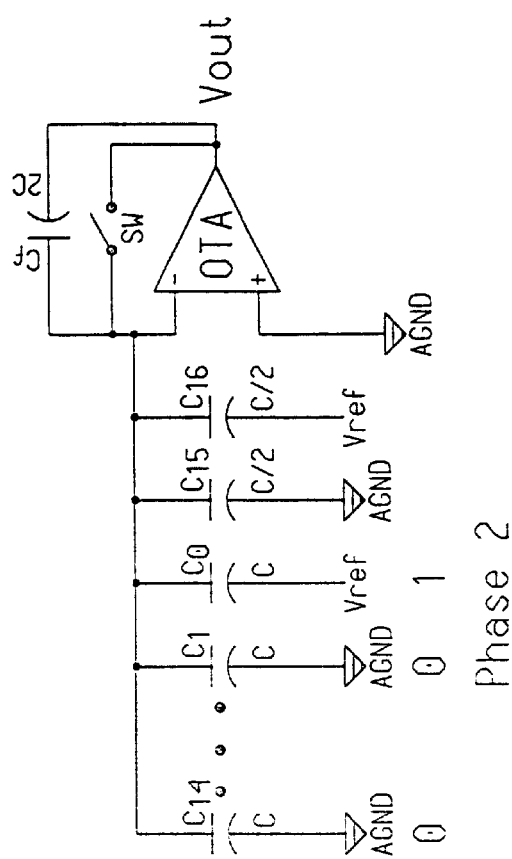
FIGS. 2A and 2B are circuit diagrams illustrating two prior art clock phase circuits for detecting code segment errors in a fully segmented capacitor MDAC.
Figure 2A:
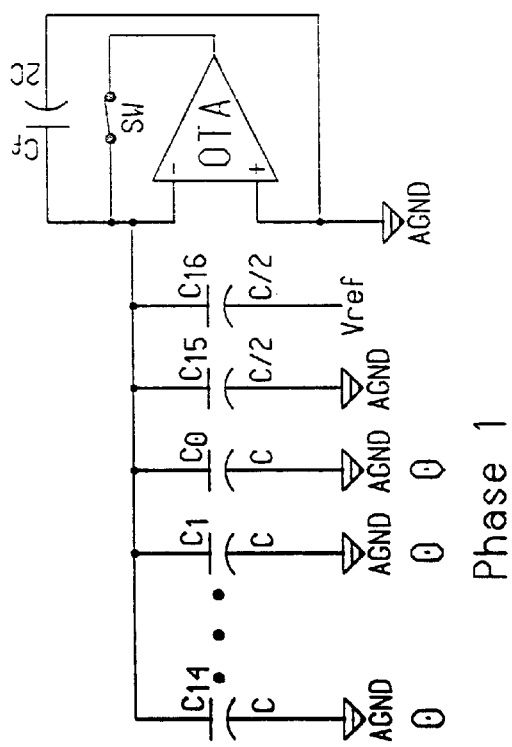

Referring now to FIGS. 2A–B, there are shown two prior art circuits representing fully segmented 4-bit MDACs. Fifteen unit capacitors, $C_0$ to $C_{14}$, serve as DAC segments. The two capacitors $C_{15}$ and $C_{16}$, each of which is one half the unit capacitor, are used to create a ½ LSB offset for the MDAC. The two phase sequence in FIGS. 2A–B detects the segment error for the DAC code transition of 0 to 1 in decimal. The non-overlapping clock signals, qs, qsp, and qg, are applied to perform this two phase operation. The fully segmented MDAC is shown here instead of the binary weighted capacitor array in FIGS. 1A–B, to reflect the actual implementation of the present invention. The fully segmented MDAC is much preferred because it can be driven directly by a thermometer code output from a flash type sub ADC of the stage. In contrast, a binary weighted MDAC requires a thermometer code to binary code translator between the flash sub ADC and the MDAC. It is well known that the signal path between the sub ADC and MDAC is one of the most critical paths with respect to its speed and that this path very often limits the speed of the overall ADC. The fundamental problem of digital truncation error accumulation applies to either case. So does the problem of sensitivity to reference voltage change between the phases.

The capacitance of each capacitor in the array is denoted as:

$$C_i = C_u + e_i, i = 0, 1, \ldots, 14 \quad (1)$$

$$C_{15} = \frac{C_u}{2} + e_{15} \quad C_{16} = \frac{C_u}{2} + e_{16} \quad (2)$$

where $e_i$ is a deviation of $C_i$ from the average unit capacitor value. The average unit capacitor value $C_u$ is given by:

$$C_u = \frac{1}{16} \cdot \sum_{i=0}^{16} C_i \quad (3)$$

By definition, the sum of deviations of all capacitors is zero.

$$\sum_{i=0}^{16} e_i = 0 \quad (4)$$

It may be seen from FIGS. 2A–B that the OTA forces its negative input to its offset voltage $V_{os}$ in phase 1 when qsp is logic HI. The total charge accumulated on the common top plate of the capacitor array and feedback capacitor is:

$$Q_T = V_{os} \cdot \left( \sum_{i=0}^{14} C_i + C_{15} + C_f \right) + (V_{os} - V_{ref}) \cdot C_{16} \quad (5)$$

The switch, SW, opens and traps $Q_T$ in addition to its own charge injection, $q_{sw}$, on the common top plate node.

$$Q_T + q_{sw} = \quad (6)$$

$$V_{os}\left(\sum_{i=1}^{14} C_i + C_{15}\right) + (V_{os} - V_{ref}) \cdot (C_0 + C_{16}) + (V_{os} - V_{out}) \cdot C_f$$

From equations (5) and (6), OTA output in phase 2, $V_{out}$, is found to be:

$$V_{out} = \frac{-(C_0 \cdot V_{ref}) - q_{sw}}{C_f} \quad (7)$$

$$= \frac{-(C_u + e_0) \cdot V_{ref} - q_{sw}}{C_f}$$

In deriving equation (6), it has been assumed that OTA has a sufficient open loop gain and that the error due to the finite open loop gain is negligible. If the open loop gain of OTA, $A_o$, is taken into account, the denominator of equation (7), $C_f$, is replaced with $C_f + (C_T/A_o)$, where $C_T$ is the sum of all capacitors sharing the common top plate at the negative input to OTA. This effect of finite $A_o$ would carry out through the following description, and it does not affect in any way the validity and technical integrity thereof.

Once the error term by $q_{sw}$ is subtracted in digital domain, the deviation of $V_{out}$ from the ideal output, $-C_u V_{ref}/C_f$, is equal to $-e_0 V_{ref}/C_f$. This error voltage is digitized by the subsequent ADCs, and the resultant digital code $D_{DLE1}$ (1) is stored in RAM. This error corresponds to DLE of the code. This sequence is repeated for all code transitions to obtain $D_{DLE}(j)$ for $j=1, 2, 3, \ldots, 15$. The segment error for $j=0$, $D_{DLE}(0)$, is obtained by connecting all the bottom plates of $C_0$ to $C_{16}$ to AGND in Phase 1 and flipping the bottom plate of $C_{16}$ only to Vref in Phase 2. The error in output $V_{out}$ from its ideal output, $-C_u V_{ref}/C_f$, is equal to $-e_{16} V_{ref}/C_f$. The segment errors are added in digital domain to produce a digital representation of ILE for all codes, as set forth in the following equation (8).

$$D_{ILE}(j) = \sum_{i=0}^{j} D_{DLE}(i) \quad j = 0, 1, \ldots, 15 \quad (8)$$

The digital representation of ILE for all codes, $D_{ILE}(0)$ to $D_{ILE}(15)$, is stored in RAM and used to correct for ILE of the MDAC during normal conversions. This process of accumulating segment errors in digital domain results in accumulation of digital truncation errors. The digital truncation error for each of $D_{DLE}(i)$ is +−0.5 lsb. with lsb being the least significant bit weight for the ADC composed of the remaining stages. Equation (8) indicates that the digital truncation error of $D_{ILE}(15)$ can be as large as +−8 lsbs. Note that $V_{out}$ given by equation (7) in the ideal case (without $e_0$ and $q_s$) would be exactly $V_{ref}/2$. This means that one half of any change in $V_{ref}$ between the two phases looks like the error $e_0$ that is being detected.

The present invention presents a means of detecting ILE of MDAC that is free from this accumulation of digital truncation errors. It detects ILE of all codes of MDAC directly, rather than detecting DLE of all codes and accumulating them to calculate ILE for all codes.

Figure 3:
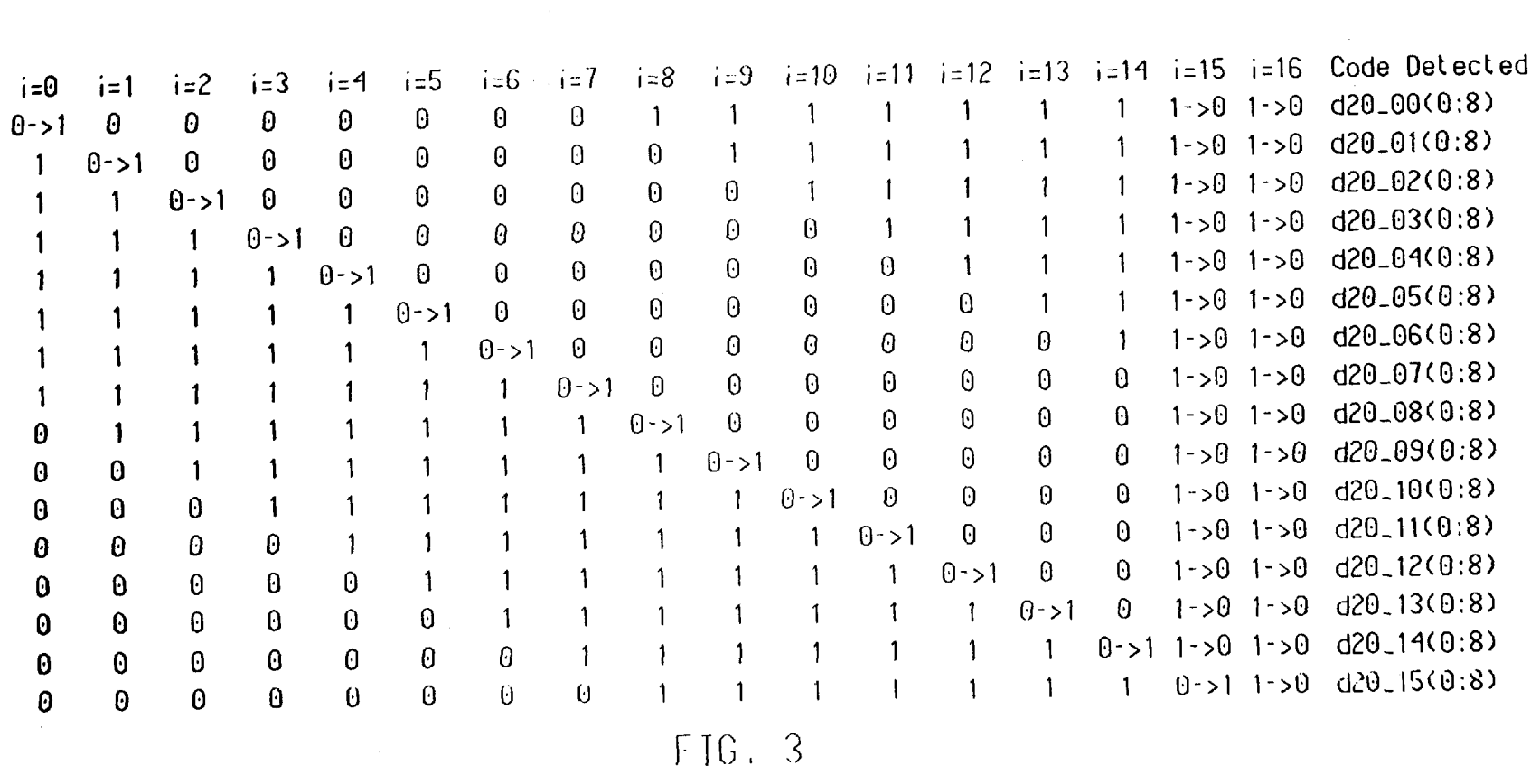

ILE calibration starts with $e_{16}$ detection. FIG. 3 shows a set of thermometer codes that drive MDAC. Each row contains a code during reset phase (Phase 1) and a code in gain phase (Phase 2). If the thermometer code is 1, the bottom plate of the corresponding capacitor $C_i$ is connected to $V_{ref}$. If it is 0, the bottom plate is connected to AGND. In the following description, the charge injection or pedestal error due to $q_{sw}$ is omitted for clarity. It is detected and corrected for in digital domain as described in the above-cited paper authored by Lee et al. The output of OTA in phase 2 corresponding to the first row in FIG. 3 will be:

$$V_{out} = \frac{V_{ref} \cdot (-e_0 + e_{15} + e_{16})}{C_f} \quad (9)$$

This error voltage is digitized to obtain the code d20_00(0:8). This digital code may be any number of bits. The representation used here reflects the actual embodiment of the invention, which happens to be 9 bits.

$$d20\_00(0:8) \leftarrow \frac{V_{ref} \cdot (-e_0 + e_{15} + e_{16})}{C_f} \quad (10)$$

Similarly, the following equations are obtained for the remainder of the table in FIG. 3 after the pedestal is subtracted:

$$d20\_j(0:8) \leftarrow \frac{V_{ref} \cdot (-e_i + e_{15} + e_{16})}{C_f} \quad (11)$$

where i=1, 2, . . . , 14

$$d20\_15(0:8) \leftarrow \frac{V_{ref} \cdot (-e_{15} + e_{16})}{C_f} \quad (12)$$

One important constraint should be noted in this table in FIG. 3 and all the remaining tables in FIGS. 4 to 18 for MDAC ILE detection. That is: the ideal output, $V_{out}$, when ILE is zero, is 0 V. This condition is imposed in order to ensure that the gain error due to an error in $V_{ref}$ between two phases has a negligible effect on the ILE measured this way.

Examining the remainder of the table and recalling equation (4), the following equation is obtained:

$$\sum_{j=0}^{14} d20\_j(0:8) \leftarrow \frac{V_{ref} \cdot \left\{ \sum_{j=0}^{14}(-e_j) + 15 \cdot (e_{15} + e_{16}) \right\}}{C_f} \quad (13)$$

$$= \frac{V_{ref} \cdot 16 \cdot (e_{15} + e_{16})}{C_f}$$

The following digital value, d2e(0)(0;8), is introduced.

$$dIe(0)(0:8) = \frac{d20\_15(0:8) + \frac{\sum_{j=0}^{14} d20\_j(0:8)}{16}}{2} \quad (14)$$

From equations (12) and (13), the following equation for d2e(0)(0;8) is obtained.

$$d2e(0)(0:8) \leftarrow \frac{V_{ref} \cdot e_{16}}{C_f} \quad (15)$$

This corresponds to ILE of MDAC for input code 0. The digital truncation error in d2e(0)(0:8) is no more than +−0.48(={0.5+0.5*(15/16)}/2) lsbs because each digital cod d20_j(0:8) in FIG. 3 has +−0.5 lsbs of truncation error.

Figure 4:
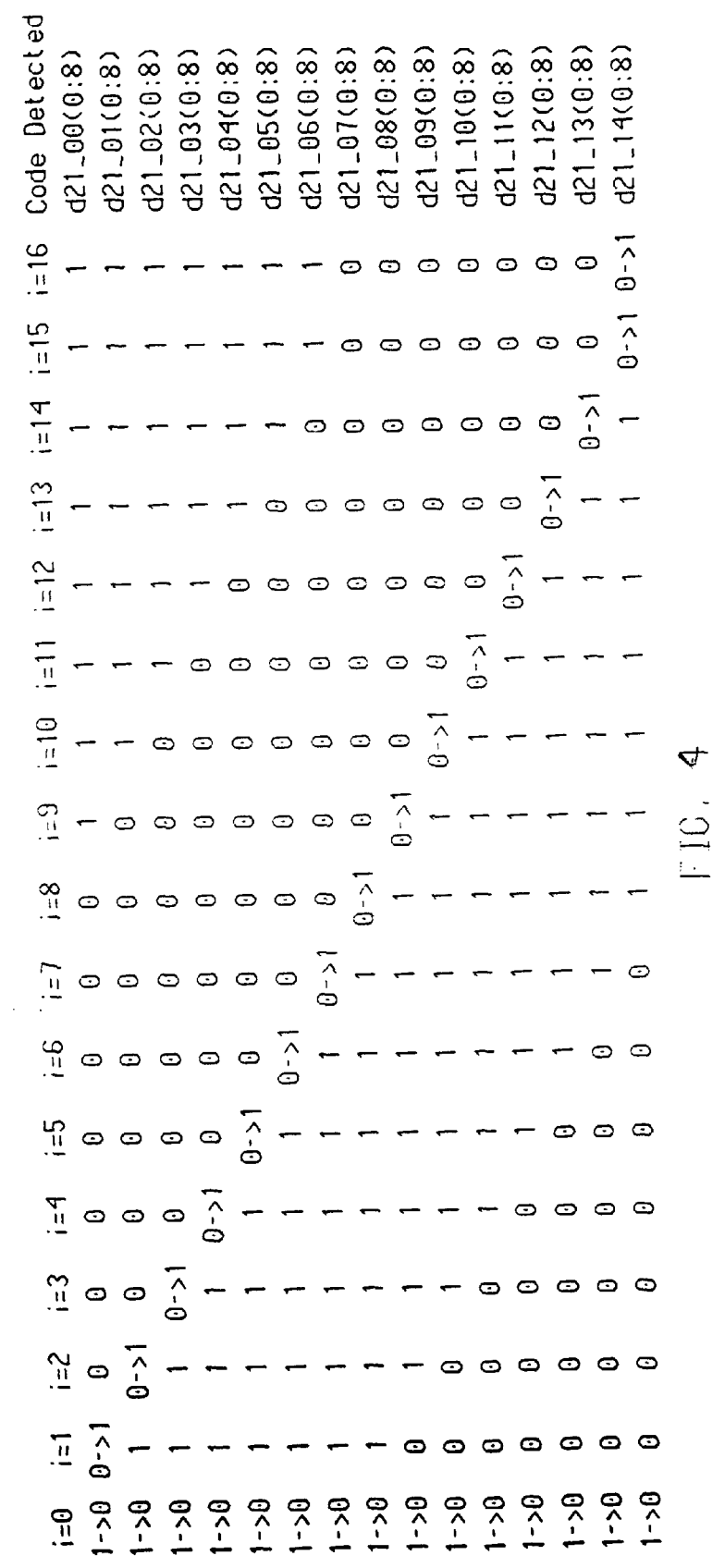

Examining the codes in FIG. 4, the following equation results:

$$\sum_{j=0}^{14} d21\_j(0:8) \leftarrow \frac{V_{ref} \cdot \left\{ 15 \cdot e_0 \sum_{j=1}^{16}(-e_j) \right\}}{C_f} \quad (16)$$

$$= \frac{V_{ref} \cdot 16 \cdot e_0}{C_f}$$

Therefore, d2e(1)(0:8) may be introduced as follows:

$$d2e(1)(0:8) = d2e(0)(0:8) + \frac{\sum_{j=0}^{14} d21\_j(0:8)}{16} \quad (17)$$

From equations (15) and (16), this corresponds to ILE of MDAC for input code 1 as shown by the following equation (18).

$$d2e(1)(0:8) \leftarrow \frac{V_{ref} \cdot (e_{16} + e_0)}{C_f} \quad (18)$$

The digital truncation error in d2e(1)(0:8) is no more than +−0.95(=0.48+(15/16)*0.5) lsbs because d2e(0)(0:8) contains +−0.48 lsb error, and the second term of the equation (17) has 0.5*15/16 lsbs of truncation error.

In order to simplify mathematical expressions, the following parameter is introduced.

$$VC = \frac{V_{ref}}{C_f} \quad (19)$$

One more example is given before deriving a general expression for ILE of MDAC. The following expressions are obtained for the detected codes in FIG. 18.

$d215\_00(0:8) \leftarrow VC\{(e_0+ \ldots +e_7)-(e_8+ \ldots +e_{14})-(e_{15}+e_{16})\}$ $d215\_01(0:8) \leftarrow VC\{(e_1+ \ldots +e_8)-(e_9+ \ldots +e_{14}+e_0)-(e_{15}+e_{16})\}$ $d215\_02(0:8) \leftarrow VC\{(e_2+ \ldots +e_9)-(e_{10}+ \ldots +e_{14}+e_0+e_1)-(e_{15}+e_{16})\}$ $d215\_03(0:8) \leftarrow VC\{(e_3+ \ldots +e_{10})-(e_{11}+ \ldots +e_{14}+e_0+ \ldots +e_2)-(e_{15}+e_{16})\}$ $d215\_04(0:8) \leftarrow VC\{(e_4+ \ldots +e_{11})-(e_{12}+ \ldots +e_{14}+e_0+ \ldots +e_3)-(e_{15}+e_{16})\}$ $d215\_05(0:8) \leftarrow VC\{(e_5+ \ldots +e_{12})-(e_{13}+e_{14}+e_0+ \ldots +e_4)-(e_{15}+e_{16})\}$ $d215\_06(0:8) \leftarrow VC\{(e_6+ \ldots +e_{13})-(e_{14}+e_0+ \ldots +e_5)-(e15+e_{16})\}$ $d215\_07(0:8) \leftarrow VC\{(e_7+ \ldots +e_{14})-(e_0+ \ldots +e_6)-(e_{15}+e_{16})\}$ $d215\_08(0:8) \leftarrow VC\{(e_8+ \ldots +e_{14}+e_0)-(e_1+ \ldots +e_7)-(e_{15}+e_{16})\}$ $d215\_09(0:8) \leftarrow VC\{(e_9+ \ldots +e_{14}+e_0+e_1)-(e_2+ \ldots +e_8)-(e_{15}+e_{16})\}$ $$d215\_10(0:8) \leftarrow VC\{(e_{10}+ \ldots +e_{14}+e_0+ \ldots +e_2)-(e_3+ \ldots +e_9)-(e_{15}+e_{16})\}$$

$$d215\_11(0:8) \leftarrow VC\{(e_{11}+ \ldots +e_{14}+e_0+ \ldots +e_3)-(e_4+ \ldots +e_{10})-(e_{15}+e_{16})\}$$

$$d215\_12(0:8) \leftarrow VC\{(e_{12}+ \ldots +e_{14}+e_0+ \ldots +e_4)-(e_5+ \ldots +e_{11})-(e_{15}+e_{16})\}$$

$$d215\_13(0:8) \leftarrow VC\{(e_{13}+e_{14}+e_0+ \ldots +e_5)-(e_6+ \ldots +e_{12})-(e_{15}+e_{16})\}$$

$$d215\_14(0:8) \leftarrow VC\{(e_{14}+e_0+ \ldots +e_6)-(e_7+ \ldots +e_{13})-(e_{15}+e_{16})\}$$

It should be noted that each code has +−0.5 lsbs of truncation error. Adding all the codes yields +−7.5 lsbs of truncation error:

$$\sum_{j=0}^{14} d215\_j(0:8) \leftarrow VC\{8 \cdot (e_0 + \ldots + e_7) - 7 \cdot (e_8 + \ldots + e_{14}) - 15 \cdot (e_{15} + e_{16})\}$$

$$= VC\{(e_0 + \ldots + e_{14}) - 15 \cdot (e_{15} + e_{16})\}$$

$$= VC\{16 \cdot (e_0 + \ldots + e_{14})\}$$

$$= \frac{V_{ref} \cdot 16 \cdot \left\{\sum_{j=0}^{14} e_j\right\}}{C_f}$$

It should be noted that the above equation divided by 16 will have +−15/16 lsb's of truncation error. Therefore, $$d2e(15)(0:8) = d2e(0)(0:8) + \frac{\sum_{j=0}^{14} d215\_j(0:8)}{16} \quad (20)$$

$$d2e(15)(0:8) \leftarrow \frac{V_{ref} \cdot \left\{e_{16} + \sum_{j=0}^{14} e_j\right\}}{C_f}. \quad (21)$$

It is obvious that d2e(15)(0:8) corresponds to ILE of MDAC for input code 15. A similar expression can be obtained for each of FIGS. 4 to 17, as shown below.

$$d2e(2)(0:8) = d2e(0)(0:8) + \frac{\sum_{j=0}^{6} d22\_j(0:8)}{8} \quad (22)$$

$$d2e(3)(0:8) = d2e(0)(0:8) + \frac{\sum_{j=0}^{12} d23\_j(0:8)}{16} \quad (23)$$

$$d2e(4)(0:8) = d2e(0)(0:8) + \frac{\sum_{j=0}^{2} d24\_j(0:8)}{4} \quad (24)$$

$$d2e(5)(0:8) = d2e(0)(0:8) + \frac{\sum_{j=0}^{10} d25\_j(0:8)}{16} \quad (25)$$

$$d2e(6)(0:8) = d2e(0)(0:8) + \frac{\sum_{j=0}^{4} d26\_j(0:8)}{8} \quad (26)$$

$$d2e(7)(0:8) = d2e(0)(0:8) + \frac{\sum_{j=0}^{8} d27\_j(0:8)}{16} \quad (27)$$

$$d2e(8)(0:8) = d2e(0)(0:8) + \frac{\sum_{j=0}^{0} d28\_j(0:8)}{2} \quad (28)$$

$$d2e(9)(0:8) = d2e(0)(0:8) + \frac{\sum_{j=0}^{8} d29\_j(0:8)}{16} \quad (29)$$

$$d2e(10)(0:8) = d2e(0)(0:8) + \frac{\sum_{j=0}^{9} d210\_j(0:8)}{16} \quad (30)$$

$$d2e(11)(0:8) = d2e(0)(0:8) + \frac{\sum_{j=0}^{10} d211\_j(0:8)}{16} \quad (31)$$

$$d2e(12)(0:8) = d2e(0)(0:8) + \frac{\sum_{j=0}^{11} d212\_j(0:8)}{16} \quad (32)$$

$$d2e(13)(0:8) = d2e(0)(0:8) + \frac{\sum_{j=0}^{12} d213\_j(0:8)}{16} \quad (33)$$

$$d2e(14)(0:8) = d2e(0)(0:8) + \frac{\sum_{j=0}^{13} d214\_j(0:8)}{16} \quad (34)$$

The numerator of the second term of right hand side of equations (22) to (34) can be derived as follows:

$$\sum_{j=0}^{6} d22\_j(0:8) \leftarrow VC\{7 \cdot (e_0 + e_1) - (e_2 + \ldots + e_{16})\} \quad (35)$$

$$= VC \cdot 8 \cdot (e_0 + e_1)$$

$$\sum_{j=0}^{12} d23\_j(0:8) \leftarrow VC\{13 \cdot (e_0 + \ldots + e_2) - 3 \cdot (e_3 + \ldots + e_{16})\} \quad (36)$$

$$= VC \cdot 16 \cdot (e_0 + \ldots + e_2)$$

$$\sum_{j=0}^{2} d24\_j(0:8) \leftarrow VC\{3 \cdot (e_0 + \ldots + e_3) - (e_4 + \ldots + e_{16})\} \quad (37)$$

$$= VC \cdot 4 \cdot (e_0 + \ldots + e_3)$$

$$\sum_{j=0}^{10} d25\_j(0:8) \leftarrow VC\{11 \cdot (e_0 + \ldots + e_4) - 5 \cdot (e_5 + \ldots + e_{16})\} \quad (38)$$

$$= VC \cdot 16 \cdot (e_0 + \ldots + e_4)$$

$$\sum_{j=0}^{4} d26\_j(0:8) \leftarrow VC\{5 \cdot (e_0 + \ldots + e_5) - 3 \cdot (e_6 + \ldots + e_{16})\} \quad (39)$$

$$= VC \cdot 8 \cdot (e_0 + \ldots + e_5)$$

$$\sum_{j=0}^{8} d27\_j(0:8) \leftarrow VC\{9 \cdot (e_0 + \ldots + e_6) - 7 \cdot (e_7 + \ldots + e_{16})\} \quad (40)$$

$$= VC \cdot 16 \cdot (e_0 + \ldots + e_6)$$

-continued $$\sum_{j=0}^{0} d28\_j(0:8) \leftarrow VC\{(e_0 + \ldots + e_7) - (e_8 + \ldots + e_{16})\} \quad (41)$$

$$= VC \cdot 2 \cdot (e_0 + \ldots + e_7)$$

$$\sum_{j=0}^{8} d29\_j(0:8) \leftarrow VC\{7 \cdot (e_0 + \ldots + e_8) - 9 \cdot (e_9 + \ldots + e_{16})\} \quad (42)$$

$$= VC \cdot 16 \cdot (e_0 + \ldots + e_8)$$

$$\sum_{j=0}^{9} d210\_j(0:8) \leftarrow VC\{6 \cdot (e_0 + \ldots + e_9) - 10 \cdot (e_{10} + \ldots + e_{16})\} \quad (43)$$

$$= VC \cdot 16 \cdot (e_0 + \ldots + e_9)$$

$$\sum_{j=0}^{10} d211\_j(0:8) \leftarrow VC\{5 \cdot (e_0 + \ldots + e_{10}) - 11 \cdot (e_{11} + \ldots + e_{16})\} \quad (44)$$

$$= VC \cdot 16 \cdot (e_0 + \ldots + e_{10})$$

$$\sum_{j=0}^{11} d212\_j(0:8) \leftarrow VC\{4 \cdot (e_0 + \ldots + e_{11}) - 12 \cdot (e_{12} + \ldots + e_{16})\} \quad (45)$$

$$= VC \cdot 16 \cdot (e_0 + \ldots + e_{11})$$

$$\sum_{j=0}^{12} d213\_j(0:8) \leftarrow VC\{3 \cdot (e_0 + \ldots + e_{12}) - 13 \cdot (e_{13} + \ldots + e_{16})\} \quad (46)$$

$$= VC \cdot 16 \cdot (e_0 + \ldots + e_{12})$$

$$\sum_{j=0}^{13} d214\_j(0:8) \leftarrow VC\{2 \cdot (e_0 + \ldots + e_{13}) - 14 \cdot (e_{14} + \ldots + e_{16})\} \quad (47)$$

$$= VC \cdot 16 \cdot (e_0 + \ldots + e_{13})$$

From equations (15), (18), (21), and (22) through (47), the results for FIGS. 3 to 18 are simply presented in the following general form.

$$d2e(N)(0:8) \leftarrow \frac{V_{ref} \cdot \left\{e_{16} + \sum_{j=0}^{N-1} e_j\right\}}{C_f} \quad (48)$$

where N=0, 1, 2, . . . , 15

Thus, MDAC ILE has been detected for code=N (N=0, 1, 2, . . . , 15) in digital domain as d2e(N)(0:8). The truncation error for each of these is less than +−1 lsb. This is another constraint imposed upon the ILE detection code setups shown in FIGS. 3 to 18. The code setups in FIGS. 3 to 18 may look overly complicated, but the reason for that lies on this constraint, which is that the digital truncation error for each ILE error code is no more than +−1 lsb.

This constraint, along with the previous constraint, overcomes the problems associated with the prior art. Once all digital codes corresponding to ILEs are obtained, they are stored in RAM and used to correct for ILE of the MDAC code during normal conversions. The correction is nothing but a digital subtraction of the ILE error of the code that is selected for the conversion.

The DAC ILE detection algorithm of the present invention may be simply applied to MDAC of any number of resolution as well as other types of DAC implementation such as a resistor string DAC, an R-2R DAC, and a binary weighted capacitor DAC.

Figure 19:
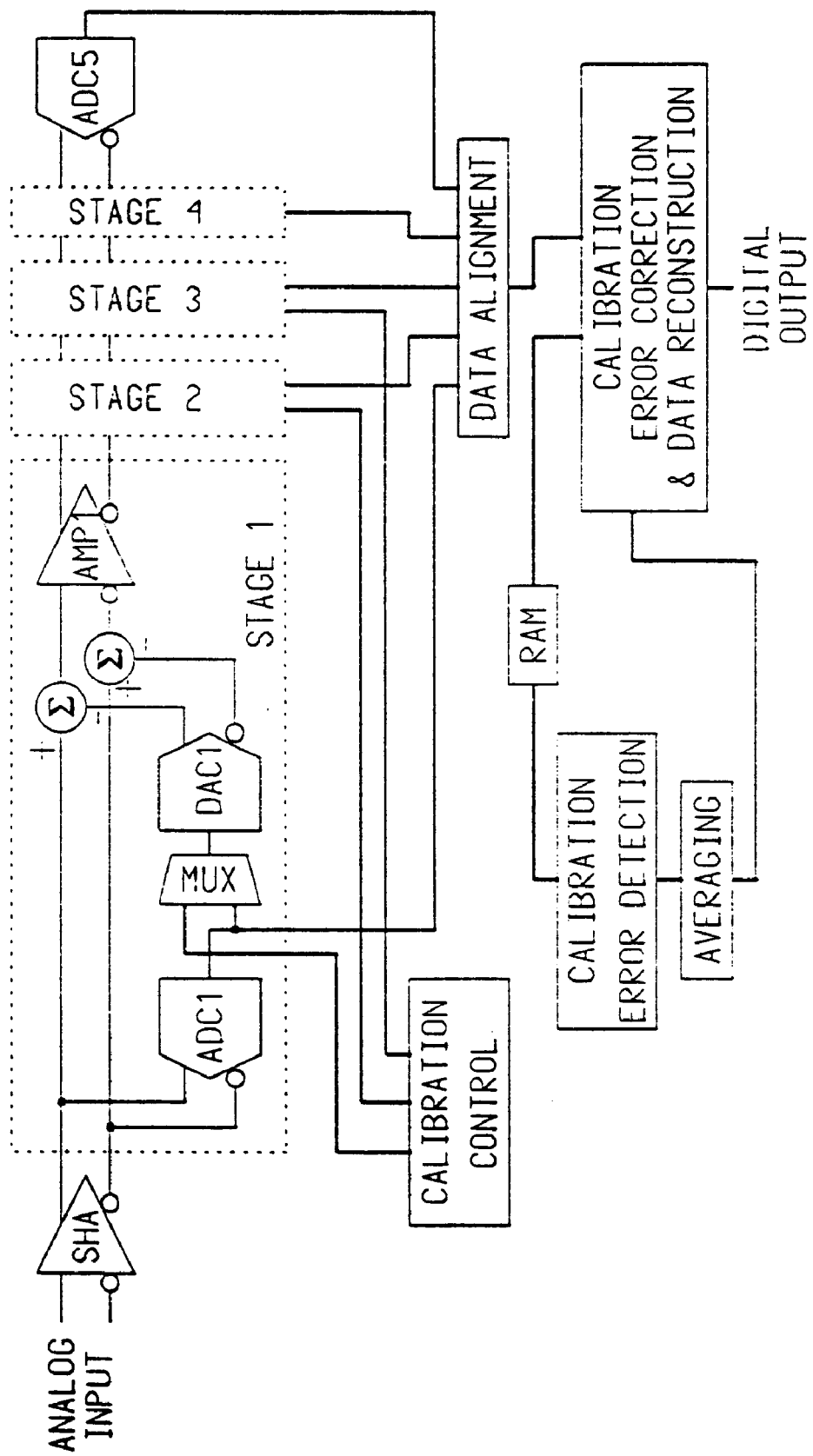
FIG. 19 is a circuit block diagram of a multi-stage pipeline ADC in accordance with an embodiment of the present invention.

FIG. 19 is a circuit block diagram representative of an embodiment of the present invention. The pipeline ADC is composed of the sample-and-hold amplifier (SHA), four stages of a flash sub ADC and an MDAC in each stage, and the last sub ADC stage (ADC5). The analog signal path in the circuit of FIG. 19 is differential, reflecting the actual embodiment of the present invention. Calibration is applied to the first three stages of the ADC since inherent errors in the stage 4 and ADC5 do not affect the accuracy of the overall ADC. Stage 3 is calibrated first, then Stage 2, and finally Stage 1. For calibration of a stage, an ADC made up of the subsequent stages is used for error detection in digital domain described above.

The Calibration Control block controls the timing and values of thermometer code setups to the stage being calibrated, in accordance with the algorithm of the present invention shown in FIGS. 3 to 18. ILE errors are detected by the subsequent stages of the ADC, after being averaged to reduce circuit noise, and stored in RAM. During normal conversions, relevant errors stored in RAM will be retrieved and used to correct errors of MDACs in Stages 1 to 3.

I claim:

1. A multi-stage pipeline analog-to-digital converter comprising:
    a sample-and-hold amplifier for sampling and holding an analog input to be converted to a digital output word and for providing an analog input to a first stage of the multi-stage pipeline analog-to-digital converter;
    a flash-type sub analog-to-digital converter in each stage for producing a digital output representing an input signal to that stage;
    a multiplying digital-to-analog converter in each stage of the multi-stage pipeline analog-to-digital converter except a final stage for producing an analog output signal proportional to said digital output from said flash-type sub analog-to-digital converter of that stage, for generating a difference signal by subtracting said analog output signal from said input signal to that stage, for amplifying said difference signal to create a residue signal, and for providing a next stage with the residue signal for successive conversion of the residue signal;
    said final stage of the multi-stage pipeline analog-to-digital converter comprising only a flash-type sub analog-to-digital converter;
    said multi-stage pipeline analog-to-digital converter further comprising:
        digital calibration means for detecting an offset or pedestal error of said sample-and-hold amplifier, as well as errors such as an offset, integral linearity errors, and gain errors, in any stage of said multiplying digital-to-analog converter;
        means for inserting a digital code into said multiplying digital-to-analog converter in a stage under calibration, including an algorithm by which appropriate digital code setups and sequences are determined and executed for driving said multiplying digital-to-analog converter in the stage under calibration, said algorithm enabling detection of said integral linearity errors of all codes of said multiplying digital-to-analog converter under calibration directly to thereby eliminate accumulation of digital truncation errors from all integral linearity errors detected;
        means for disconnecting an output from a previous stage of said multi-stage pipeline analog-to-digital converter to the stage under calibration;
        a digital averaging circuit for producing an average digital output of an analog-to-digital converter comprising those stage subsequent to the stage under calibration in order to reduce noise contribution to the calibration;

a memory for storing all of said digital words representing said detected errors; and calibration control logic for digitally controlling said digital calibration means, said means for inserting a digital code, said means for disconnecting an output, said digital averaging circuit, said digital means for calculating digital words, and said memory.

2. A multi-stage pipeline analog-to-digital converter as in claim 1, wherein:

said multiplying digital-to-analog converter in each stage comprises a fully segmented capacitor array to speed operation by directly accepting a thermometer code of said flash-typ sub analog-to-digital converter, said multiplying digital-to-analog converter in each stage further comprising an operational transconductance amplifier, a feedback capacitor, and a plurality of switches for selectively connecting each one of a plurality of bottom plates of said capacitor array to an appropriate voltage reference node; and said algorithm is operative for enabling detection of said integral linearity errors with a significant reduction in sensitivity to the voltage at said voltage reference node and to the gain error by forcing the error voltage at the output of said multiplying digital-to-analog converter under calibration to substantially zero volts by detecting a difference in capacitance of two groups of equal numbers of individual capacitors of said fully segmented capacitor array.

3. A multi-stage pipeline analog-to-digital converter as in claim 2, wherein said multiplying digital-to-analog converter in each stage has an amplifier gain such that an ideal residue signal range, when there are no errors in the multiplying digital-to-analog converter or in the flash-type sub analog-to-digital converter, is not greater than one-half of a full scale input range of the next stage, thereby insuring that any error combination per stage will not result in an output exceeding a full scale input range of said next stage;

said multi-stage pipeline analog-to-digital converter further comprising:

digital logic for receiving digital outputs from said flash-type sub analog-to-digital converter of each stage and for time-aligning all of the outputs; and digital correction logic for generating an error-free digital output of the multi-stage analog-to-digital converter from said time-aligned digital outputs and selected contents of said memory.

4. A method for performing internal digital calibration of a multi-stage pipeline analog-to-digital converter, comprising:

sampling and holding an analog input to be converted to a digital output word;

providing said analog input to a first stage of the multi-stage pipeline analog-to-digital converter;

producing a plurality of digital outputs, each of which is representative of an input signal applied to a corresponding one of the stages of the multi-stage pipeline analog-to-digital converter;

producing an analog output signal at each stage of the multi-stage pipeline analog-to-digital converter except a final stage thereof, said analog output signal being proportional to the corresponding one of said plurality of digital outputs;

generating a difference signal at each stage of the multi-stage pipeline analog-to-digital converter, except said final stage, by subtracting said analog output signal from said input signal at each stage;

amplifying said difference signal so generated at each stage of the multi-stage analog-to-digital converter to form a residue signal;

applying said residue signal so formed at each stage of said multi-stage analog-to-digital converter to a subsequent stage of the multi-stage pipeline analog-to-digital converter for successive conversion of said residue signal;

detecting an offset or pedestal error in a sample-and-hold amplifier of said multi-stage pipeline analog-to-digital converter and in a multiplying digital-to-analog converter in any stage of said multi-stage pipeline analog-to-digitial converter and detecting other errors in multiplying digital-to-analog converters in any stage of said multi-stage pipeline analog-to-digital converter;

inserting a digital code into a multiplying digital-to-analog converter in a stage under calibration of said multi-stage pipeline analog-to-digital converter;

disconnecting an output from a previous stage to said stage under calibration;

providing an algorithm for determining and executing digital code setups and sequences for driving said multiplying digital-to-analog converter in said stage under calibration, said algorithm being operative for enabling detection of said integral linearity errors of all codes of said multiplying digital-to-analog converter under calibration directly to thereby eliminate accumulation of digital truncation errors from all integral linearity errors detected;

calculating digital words representing said errors detected in said stage under calibration; and storing said digital words representing said detected errors.

5. A method as in claim 4, further comprising:

adjusting an amplifier gain of the multiplying digital-to-analog converter in each stage of said multi-stage analog-to-digital converter such that an ideal residue signal range, in the absence of errors, is no greater than one-half of a full scale input range of the next stage, to thereby insure that any error combination per stage will not result in an output exceeding a full scale input range of the next stage;

time-aligning said plurality of digital outputs; and logically generating an error-free output of the multi-stage pipeline analog-to-digital converter from said time-aligned plurality of digital outputs and selected ones of said stored digital words.

* * * * *